(12) United States Patent
Li

(10) Patent No.: US 12,744,295 B2
(45) Date of Patent: Sep. 22, 2026

(54) MILLIMETER WAVE STRUCTURE INCLUDING A SHIELDED SUBSTRATE HAVING A METAL SHEET THEREIN AND USABLE IN A MILLIMETER WAVE MEASUREMENT MODULE

(71) Applicant: UNIVERSAL SCIENTIFIC INDUSTRIAL ( SHANGHAI ) CO., LTD., Shanghai (CN)

(72) Inventor: Kuan-Hsing Li, Shanghai (CN)

(73) Assignee: UNIVERSAL SCIENTIFIC INDUSTRIAL ( SHANGHAI ) CO., LTD., Shanghai (CN)

( * ) Notice: Subject to any disclaimer, the term of this patent is extended or adjusted under 35 U.S.C. 154(b) by 325 days.

(21) Appl. No.: 18/630,232

(22) Filed: Apr. 9, 2024

(65) Prior Publication Data

US 2025/0226563 A1 Jul. 10, 2025

(30) Foreign Application Priority Data

Jan. 10, 2024 (CN) ......................... 202410039024.1

(51) Int. Cl.

*H01P 3/12* (2006.01)
*G01R 1/24* (2006.01)
*G01R 29/08* (2006.01)
*H01P 1/00* (2006.01)

(52) U.S. Cl.

CPC ................ *H01P 3/121* (2013.01); *G01R 1/24* (2013.01); *G01R 29/0871* (2013.01); *H01P 1/00* (2013.01)

(58) Field of Classification Search

CPC ................................. H01P 3/121; G01R 1/24
USPC ......................................................... 333/248
See application file for complete search history.

(56) References Cited

U.S. PATENT DOCUMENTS

| | | | | |
|---|---|---|---|---|
| 8,760,342 | B2 * | 6/2014 | Hayata | H01P 3/121 342/175 |
| 9,825,667 | B2 | 11/2017 | Kawasaki | |
| 11,303,004 | B2 | 4/2022 | Yung et al. | |
| 2017/0003377 | A1 * | 1/2017 | Menge | H01P 3/121 |
| 2019/0089042 | A1 * | 3/2019 | Purden et al. | H01Q 13/06 |

FOREIGN PATENT DOCUMENTS

| | | | |
|---|---|---|---|
| CN | 111562443 | A | 8/2020 |
| CN | 214225336 | U | 9/2021 |
| CN | 216055123 | U | 3/2022 |
| JP | 2021530888 | A | 11/2021 |

* cited by examiner

*Primary Examiner* — Benny T Lee
(74) *Attorney, Agent, or Firm* — Li & Cai Intellectual Property (USA) Office

(57) ABSTRACT

A millimeter wave circuit structure and a millimeter wave module measure equipment are provided. The millimeter wave circuit structure includes a substrate, two metal through hole groups, a signal feed-in structure, a signal feed-out structure, a metal shielding cover and a metal sheet. Each of the metal through hole groups penetrates the substrate. The signal feed-in structure and the signal feed-out structure are provided inside the substrate. The metal shielding cover is connected to the substrate. The metal sheet is located inside the metal shielding cover. The metal sheet is provided with a first notch and a second notch and is electrically connected to the signal feed-in structure and the signal feed-out structure.

10 Claims, 12 Drawing Sheets

MILLIMETER WAVE STRUCTURE INCLUDING A SHIELDED SUBSTRATE HAVING A METAL SHEET THEREIN AND USABLE IN A MILLIMETER WAVE MEASUREMENT MODULE

CROSS-REFERENCE TO RELATED PATENT APPLICATION

This application claims the benefit of priority to China Patent Application No. 202410039024.1, filed on Jan. 10, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a millimeter wave circuit structure and a millimeter wave module measure equipment, and more particularly to a millimeter wave circuit structure related to a substrate integrated waveguide and a millimeter wave module measure equipment related to the substrate integrated waveguide.

BACKGROUND OF THE DISCLOSURE

Due to continuous improvements to mobile communication network systems, more frequency bands must be developed in order to satisfy advanced digital applications. With respect to the development of a fifth generation (i.e. 5G) wireless system, in addition to a Frequency Range 1 (FR1, sub-6 GHZ), a Frequency Range 2 (FR2) is now also utilized. Recently, a 3rd Generation Partnership Project (3GPP) has also been utilized to 71 GHz. However, energy loss of wirings on a substrate is more severe at the higher frequency band.

In order to reduce the energy loss, a rectangular waveguide with low energy loss was developed. However, the rectangular waveguide must use adapters to integrate with circuits, which increases manufacturing cost.

In view of the above-mentioned problems of the rectangular waveguide, a substrate integrated waveguide has replaced the rectangular waveguide in recent years. The substrate integrated waveguide can be integrated with circuits without adapters. However, when an electromagnetic wave is transmitted in the medium of the substrate integrated waveguide, the energy of the electromagnetic wave is reduced.

SUMMARY OF THE DISCLOSURE

In response to the above-referenced technical inadequacy, the present disclosure provides a millimeter wave circuit structure and a millimeter wave module measurement device.

In order to solve the above-mentioned problems, one of the technical aspects adopted by the present disclosure is to provide a millimeter wave circuit structure. The millimeter wave circuit structure includes a substrate, two metal through hole groups, a signal feed-in structure, a signal feed-out structure, a metal shielding cover, and a metal sheet. The substrate is provided with a first conductive through hole, a second conductive through hole, a first welding pad and a second welding pad. The first conductive through hole and the second conductive through hole are connected to the first welding pad and the second welding pad, respectively. The two metal through hole groups penetrate through the substrate. The signal feed-in structure is provided inside the substrate and connected to the first conductive through hole. The signal feed-out structure is provided inside the substrate and connected to the second conductive through hole. The metal shielding cover is connected to a top of the substrate and located between the two metal through hole groups. A first side of the metal sheet is connected to the first welding pad and the second welding pad. The metal sheet is located inside the metal shielding cover and the first side of the metal sheet is provided with a first notch and a second notch. The metal sheet is electrically connected to the signal feed-in structure and the signal feed-out structure by the first conductive through hole and the second conductive through hole, respectively.

In one of the possible or preferred embodiments, a ratio of a width of the first notch to a height of the first notch is greater than two and less than or equal to twenty, and a ratio of a width of the second notch to a height of the second notch is greater than two and less than or equal to twenty.

In one of the possible or preferred embodiments, the first side of the metal sheet is provided with a first leg portion, a second leg portion and a third leg portion, the first notch is located between the first leg portion and the third leg portion and is connected to the first welding pad, and the a second gap is located between the third leg portion and the second leg portion and is connected to the second welding pad.

In one of the possible or preferred embodiments, the first notch has a third width, a second distance is defined between the metal sheet and the metal shielding cover along a second direction, and a ratio of the second distance to the third width is equal to one.

In one of the possible or preferred embodiments, the metal sheet includes a first plate and a second plate, the first plate is connected to the first welding pad and the second welding pad, the first plate is provided with the first notch and the second notch, the second plate is connected to the first plate, and the second plate is bent at a bending angle relative to the first plate.

In order to solve the above-mentioned problems, another one of the technical aspects adopted by the present disclosure is to provide a millimeter wave module measurement device. The millimeter wave module measure equipment includes a measurement carrier board, a jig, and a plurality of millimeter wave circuit structures. The jig is assembled to the measurement carrier board and configured to carry a millimeter wave module. The millimeter wave module includes a plurality of signal pins. The plurality of millimeter wave circuit structures is assembled on the measurement carrier board and electrically connected to the plurality of the signal pins, respectively. Each of the millimeter wave circuit structures includes a substrate, two metal through hole groups, a signal feed-in structure, a signal feed-out structure, a metal shielding cover, and a metal sheet. The substrate is provided with a first conductive through hole, a second conductive through hole, a first welding pad and a second welding pad. The first conductive through hole and the second conductive through hole are connected to the first welding pad and the second welding pad, respectively. Each of the metal through hole groups penetrates the substrate. The signal feed-in structure is provided inside the substrate and connected to the first conductive through hole and one of the signal pins correspondingly. The signal feed-out structure is provided inside the substrate and connected to the second conductive through hole. The metal shielding cover is connected to a top of the substrate and located between the two metal through hole groups. A first side of the metal sheet is connected to the first welding pad and the second welding pad. The metal sheet is located inside the metal shielding cover and the first side of the metal sheet is provided with a first notch and a second notch. The metal sheet is electrically connected to the signal feed-in structure and the signal feed-out structure by the first conductive through hole and the second conductive through hole, respectively.

In one of the possible or preferred embodiments, a ratio of a width of the first notch to a height of the first notch is greater than two and less than or equal to twenty, and a ratio of a width of the second notch to a height of the second notch is greater than two and less than or equal to twenty.

In one of the possible or preferred embodiments, the first side of the metal sheet is provided with a first leg portion, a second leg portion and a third leg portion, the first notch is located between the first leg portion and the third leg portion, the first leg portion is connected to the first welding pad, the second notch is located between the third pin and the second leg portion, and the second leg portion is connected to the second welding pad.

In one of the possible or preferred embodiments, the first notch has a third width, a second distance is defined between the metal sheet and the metal shielding cover along a second direction, and a ratio of the second distance to the third width is equal to one.

In one of the possible or preferred embodiments, the metal sheet includes a first plate and a second plate, the first plate is connected to the first welding pad and the second welding pad, the first plate is provided with the first notch and the second notch, the second plate is connected to the first plate, and the second plate is bent at a bending angle relative to the first plate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the detail description of the drawings indicate like components throughout the drawings. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 1:
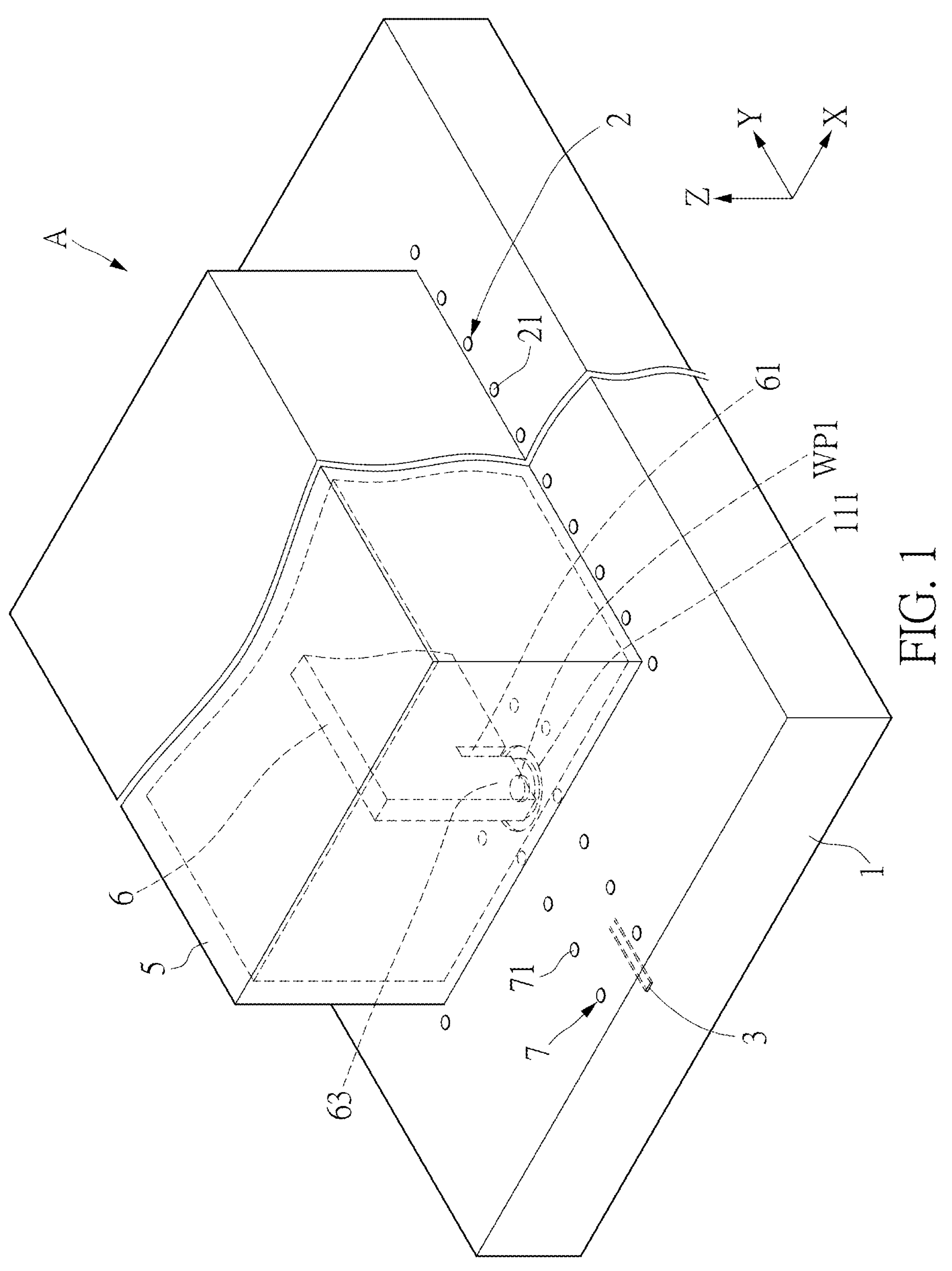
FIG. 1 is a schematic perspective view of a millimeter wave circuit structure according to a first embodiment of the present disclosure.
Figure 2:
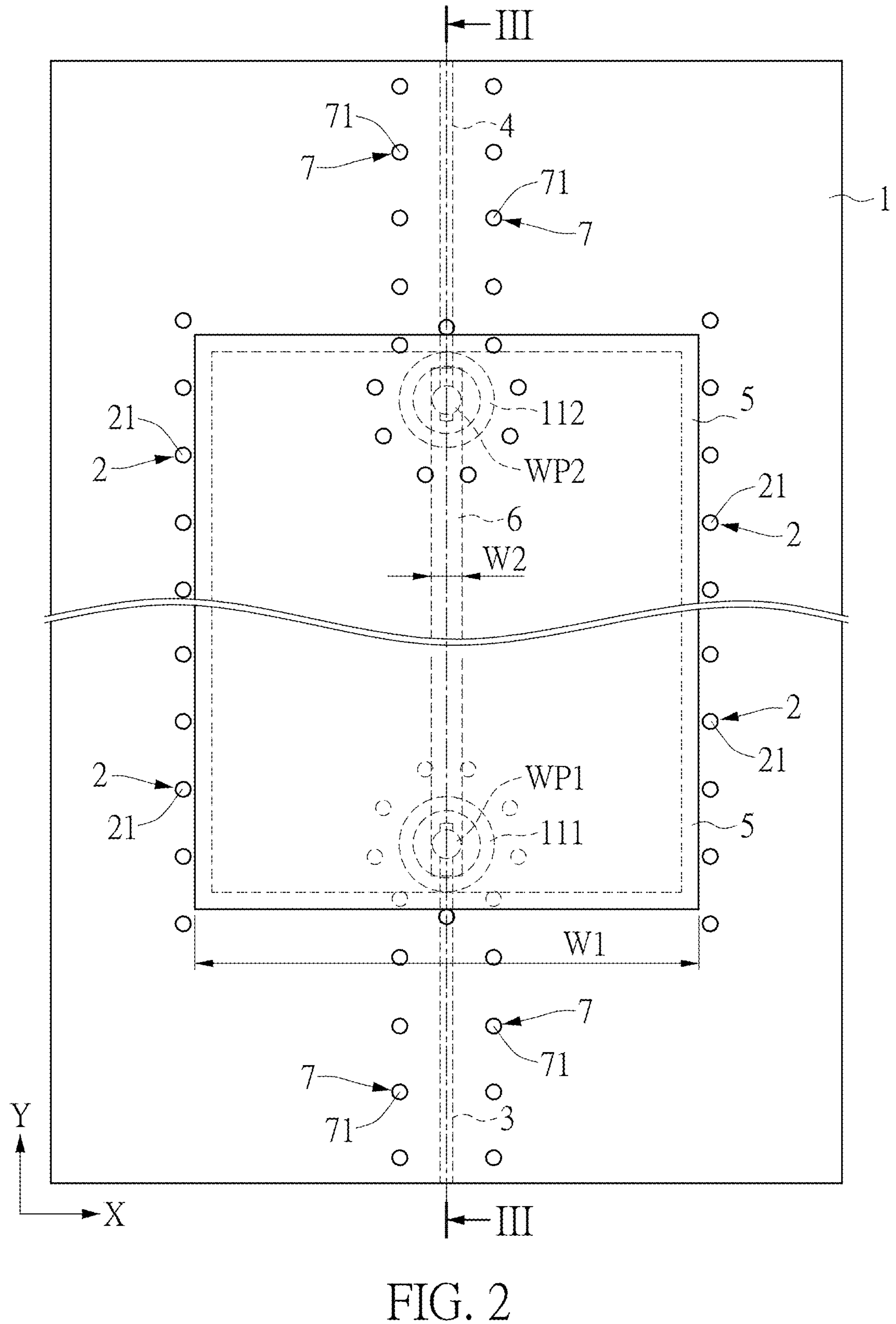
FIG. 2 is a top view of the millimeter wave circuit structure of FIG. 1.

FIG. 1 is a schematic perspective view of a millimeter wave circuit structure according to a first embodiment of the present disclosure, and FIG. 2 is a top view of the millimeter wave circuit structure A of FIG. 1. Referring to FIGS. 1 and 2, the millimeter wave circuit structure A includes a substrate 1, two first metal through hole groups 2, a signal feed-in structure 3, a signal feed-out structure 4 (FIG. 2), a metal shielding cover 5, a metal sheet 6, and two second metal through hole groups 7. Each of the first metal through hole groups 2 and each of the second metal through hole groups 7 penetrate the substrate 1. The signal feed-in structure 3 and the signal feed-out structure 4 are, for example, two striplines. The signal feed-in structure 3 and the signal feed-out structure 4 are provided in the substrate 1 and are respectively located between the two second metal through hole groups 7.

The metal shielding cover 5 and the metal sheet 6 are connected to a top of the substrate 1 and are located between the two first metal through hole groups 2 to form a substrate integrated waveguide (SIW), and the metal sheet 6 is located in the metal shielding cover 5. In this embodiment, a ratio of a first width W1 of the metal shielding cover 5 to a second width W2 of the metal sheet 6 is 15:1. For example, as shown in FIG. 2, the first width W1 and the second width W2 are 3 millimeters (mm) and 0.2 mm respectively.

Figure 3:
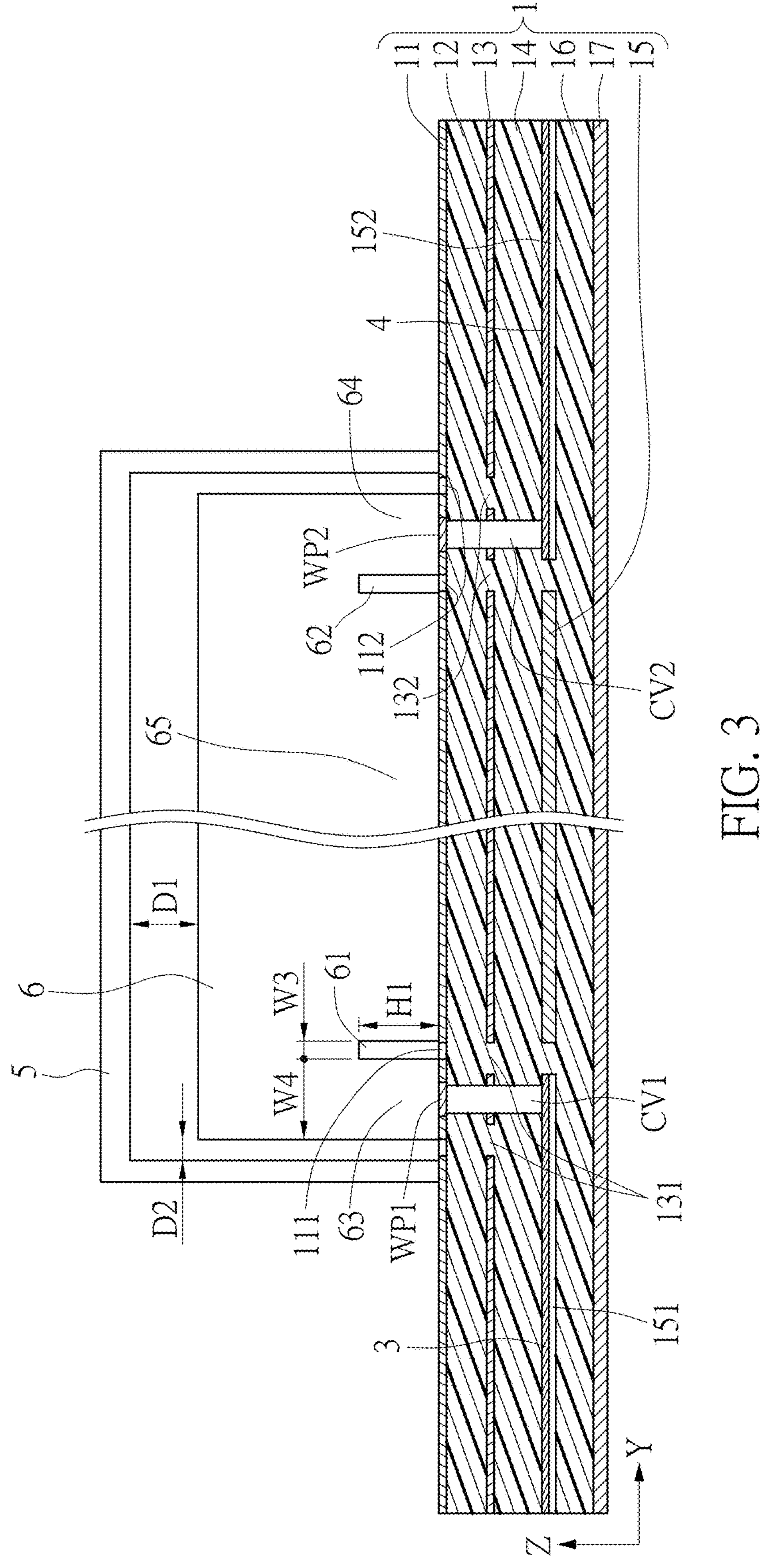
FIG. 3 is a schematic cross-sectional view taken along line III-III of FIG. 2.

FIG. 3 is a schematic cross-sectional view taken along line III-III of FIG. 2. Referring to FIG. 3, the substrate 1 is, for example, a multi-layer printed circuit board or a flexible circuit board. The substrate 1 includes a top metal layer 11, a first dielectric layer 12, a first inner metal layer 13, and a second dielectric layer 14, a second inner metal layer 15, a third dielectric layer 16 and a bottom metal layer 17. The components of the first dielectric layer 12, the second dielectric layer 14 and the third dielectric layer 16 are insulating materials, such as polyimide or liquid crystal molecular polymer. The components of the top metal layer 11, the first inner metal layer 13, the second inner metal layer 15 and the bottom metal layer 17 are, for example, copper. The metal shielding cover 5 and the metal sheet 6 are provided on the top metal layer 11. The first dielectric layer 12 is disposed between the top metal layer 11 and the first inner metal layer 13. The second dielectric layer 14 is disposed between the first inner metal layer 13 and the second inner metal layer 15. The third dielectric layer 16 is disposed between the second inner metal layer 15 and the bottom metal layer 17. The first inner metal layer 13 is provided with an annular third opening 131 and an annular fourth opening 132. The second inner metal layer 15 is provided with a fifth opening 151 and a sixth opening 152.

The substrate 1 is provided with a first conductive through hole CV1, a second conductive through hole CV2, a first welding pad WP1 and a second welding pad WP2. An upper end and a lower end of the first conductive through hole CV1 are connected to the first welding pad WP1 and the signal feed-in structure 3, respectively. An upper end and a lower end of the second conductive through hole CV2 are connected to the second welding pad WP2 and the signal feed-out structure 4, respectively. The first welding pad WP1 and the second welding pad WP2 are connected to a first side of the metal sheet 6. The metal sheet 6 is located inside the metal shielding cover 5, and the first side of the metal sheet 6 connected to the first welding pad WP1 and the second welding pad WP2 is provided with a first notch 61, a second notch 62, a first leg portion 63, a second leg portion 64 and a third leg portion 65. The first notch 61 is located between the first leg portion 63 and the third pin 6 leg portion 5, and the second notch 62 is located between the third leg portion 65 and the second leg portion 64.

The first leg portion 63 of the metal sheet 6 is connected to the first welding pad WP1, the second leg portion 64 of the metal sheet 6 is connected to the second welding pad WP2, and the third leg portion 65 of the metal sheet 6 is connected to the top metal layer 11.

The top metal layer 11 is also provided with an annular first opening 111 and an annular second opening 112, in which the first opening 111 is located at a periphery of the first welding pad WP1, and a part of the first opening 111 is located below the first notch 61. The second opening 112 is located at a periphery of the second welding pad WP2, and a part of the second opening 112 is located below the second notch 62.

Since the first leg portion 63, the first notch 61, the second notch 62, the second leg portion 64 and the third leg portion 65 are used for impedance matching purposes, the sizes of the first leg portion 63, the first notch 61, the second notch 62, the second leg portion 64 and the third leg portion 65 should be designed accordingly. In this embodiment, the first notch 61 and the second notch 62 have a third width W3 and a first height H1, and a ratio of the third width W3 to the first height H1 is greater than two and less than or equal to twenty, and the first height H1 is smaller than a height of the metal sheet 6. For example, the third width W3 is 0.1 millimeter (mm), the first height H1 is 0.25 mm, and the ratio of the third width W3 to the first height H1 is 1:2.5.

In this embodiment, the first leg portion 63 and the second leg portion 64 have a fourth width W4, and a ratio of the fourth width W4 to the third width W3 of the first notch 61 is greater than two and less than or equal to four. For example, the third width W3 and the fourth width W4 are 0.1 mm and 0.36 mm, respectively, and the ratio of the fourth width W4 and the third width W3 is 3.6:1.

There is a first distance D1 between the metal sheet 6 and the metal shielding cover 5 along a Z-axis direction, and a second distance D2 is defined between the metal sheet 6 and the metal shielding cover 5 along a Y-axis direction. The first distance D1 affects an operating frequency of an electromagnetic wave signal, and the second distance D2 is equal to the third width W3 of the first notch 61.

Figure 4:
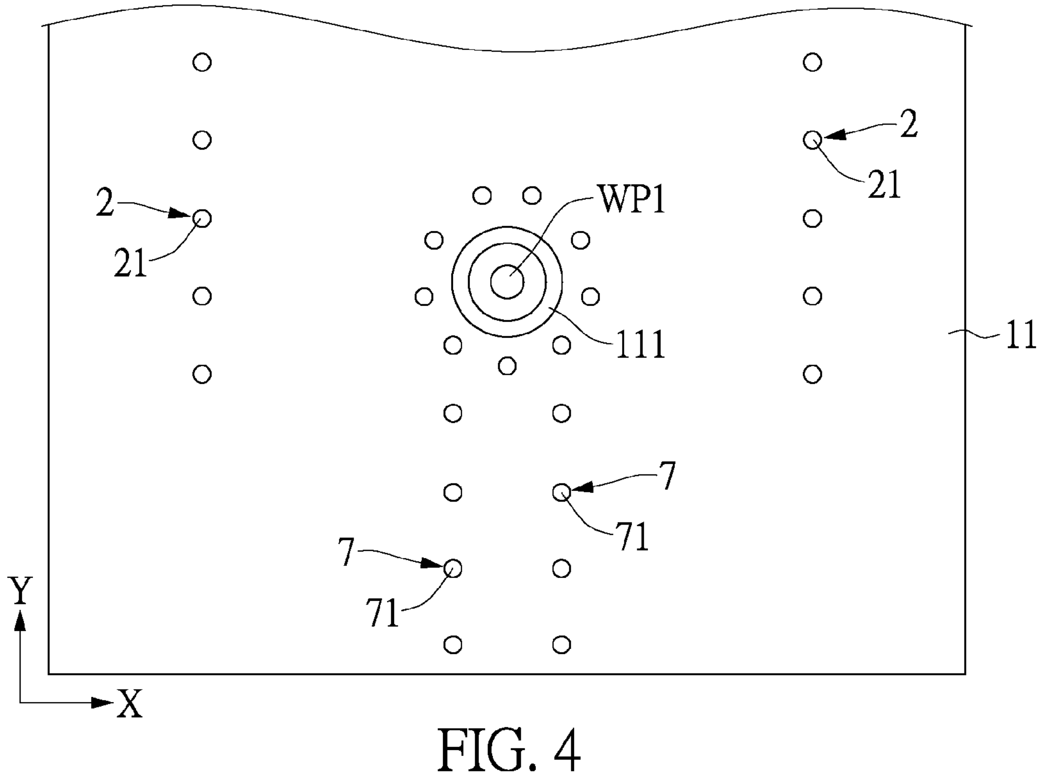
FIG. 4 is a partial schematic top view of a top metal layer of FIG. 3.

FIG. 4 is a partial schematic top view of the top metal layer 11 of FIG. 3. Referring to FIG. 4, the first welding pad WP1 and the second welding pad WP2 (FIG. 3) are provided on the top metal layer 11, and the first opening 111 and the second opening 112 (FIG. 3) are located around the first welding pad WP1 and around the second welding pad WP2 (FIG. 3), respectively. Each of the first metal through hole groups 2 includes a plurality of first metal through holes 21. Each of the second metal through hole groups 7 includes a plurality of second metal through holes 71. Each of the first metal through holes 21 and each of the second metal through holes 71 penetrate the top metal layer 11. Each of the second metal through hole groups 7 is located between the two first metal through hole groups 2 in an X-axis direction. One of the second metal through hole groups 7 surrounds the first welding pad WP1 and the signal feed-in structure 3 (FIG. 3). The other one of the second metal through-hole groups 7 surrounds the second welding pad WP2 (FIG. 3) and the signal feed-out structure 4 (FIG. 3).

Figure 5:
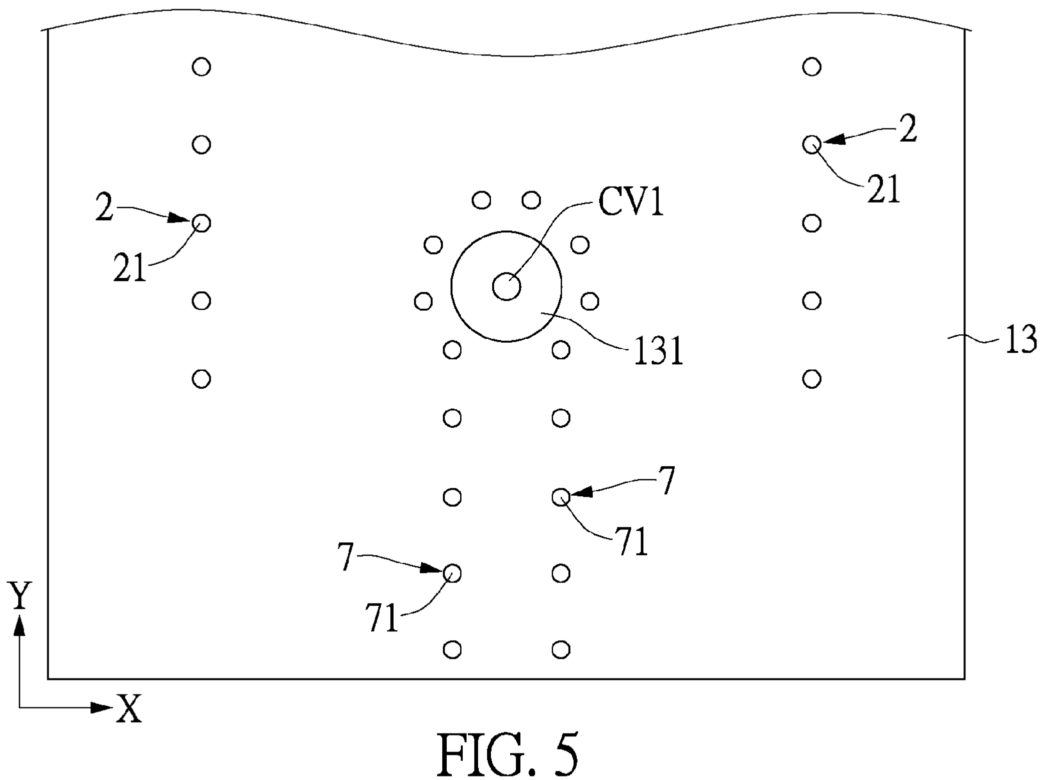
FIG. 5 is a partial schematic top view of a first inner metal layer of FIG. 3.

FIG. 5 is a partial schematic top view of the first inner metal layer 13 of FIG. 3. Referring to FIG. 5, the first conductive through hole CV1 (FIG. 3) and the second conductive through hole CV2 (FIG. 3) penetrate the first inner metal layer 13. The first inner metal layer 13 is provided with an annular third opening 131 and an annular fourth opening 132 (FIG. 3). The third opening 131 and the fourth opening 132 (FIG. 3) are located around the first conductive through hole CV1 (FIG. 3) and around the second conductive through hole CV2 (FIG. 3), respectively. Each of the first metal through holes 21 and each of the second metal through holes 71 penetrate the first inner metal layer 13, and the two second metal through hole groups 7 surround the third opening 131 (FIG. 3) and the fourth opening 132 (FIG. 3), respectively.

Figure 6:
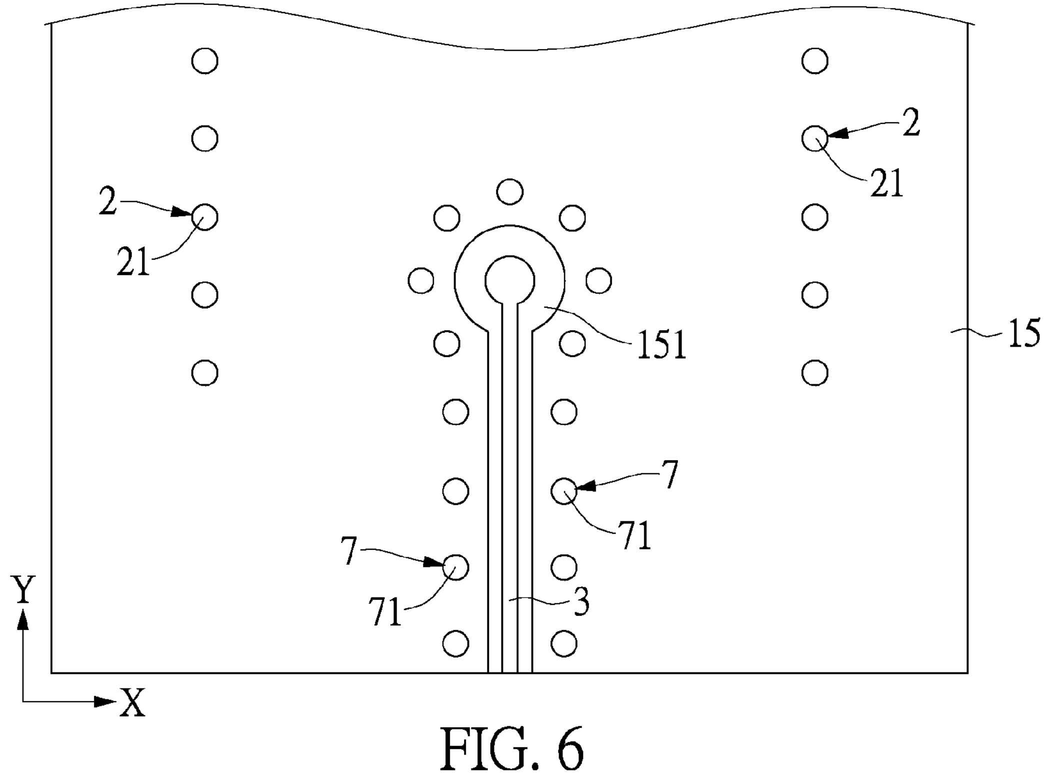
FIG. 6 is a partial schematic top view of a second inner metal layer of FIG. 3.

FIG. 6 is a partial schematic top view of the second inner metal layer 15 of FIG. 3. Referring to FIG. 6, the second inner metal layer 15 is provided with a fifth opening 151 and a sixth opening 152 (FIG. 3). The signal feed-in structure 3 and the signal feed-out structure 4 (FIG. 3) are located at the fifth opening 151 and the sixth opening 152 (FIG. 3), respectively. Each of the first metal through holes 21 and each of the second metal through holes 71 penetrate the second inner metal layer 15, and the two second metal through hole groups 7 surround the fifth opening 151 and the sixth opening 152 (FIG. 3), respectively.

Figure 7:
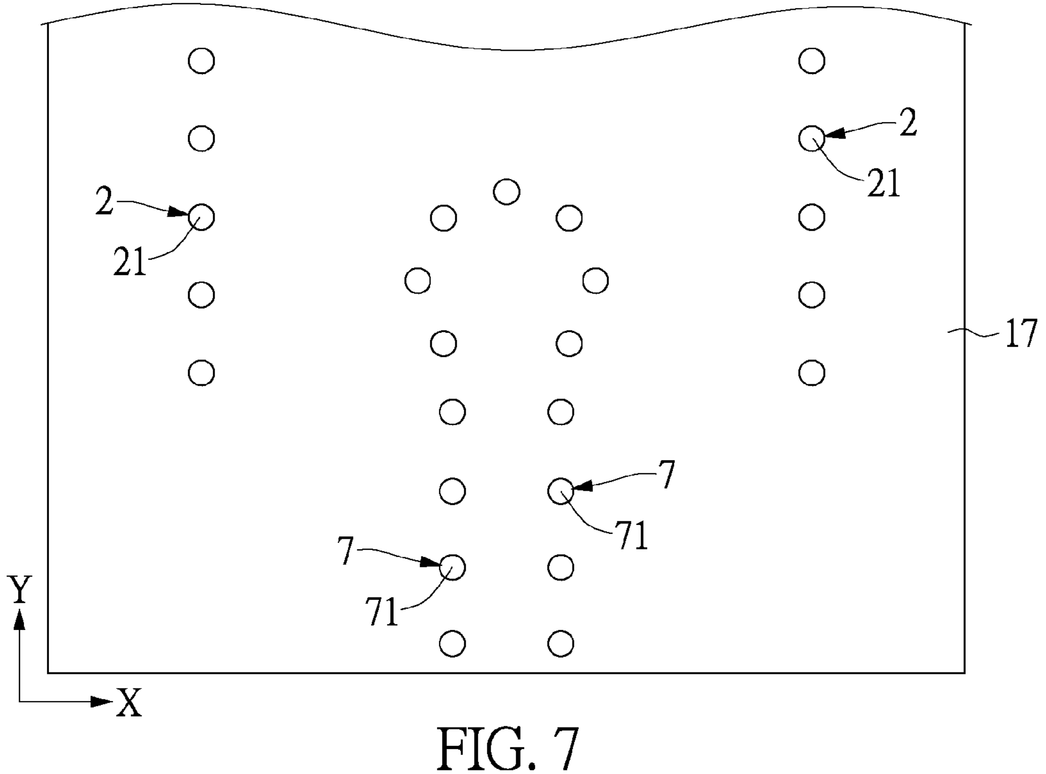
FIG. 7 is a partial schematic top view of a bottom metal layer of FIG. 3.

FIG. 7 is a partial schematic top view of the bottom metal layer 17 of FIG. 3. Referring to FIG. 7, each of the first metal through holes 21 and each of the second metal through holes 71 penetrate the bottom metal layer 17, and the two second metal through hole groups 7 are located between the two first metal through hole groups 2.

When an electromagnetic wave signal feeds the signal feed-in structure 3 FIG. 3) of the substrate 1 (FIG. 3), the electromagnetic wave signal is transmitted to the signal feed-out structure 4 (FIG. 3) through the air between the metal shielding cover 5 (FIG. 3) and the metal sheet 6 (FIG. 3) and by the second conductive through hole CV2 (FIG. 3).

Figure 8:
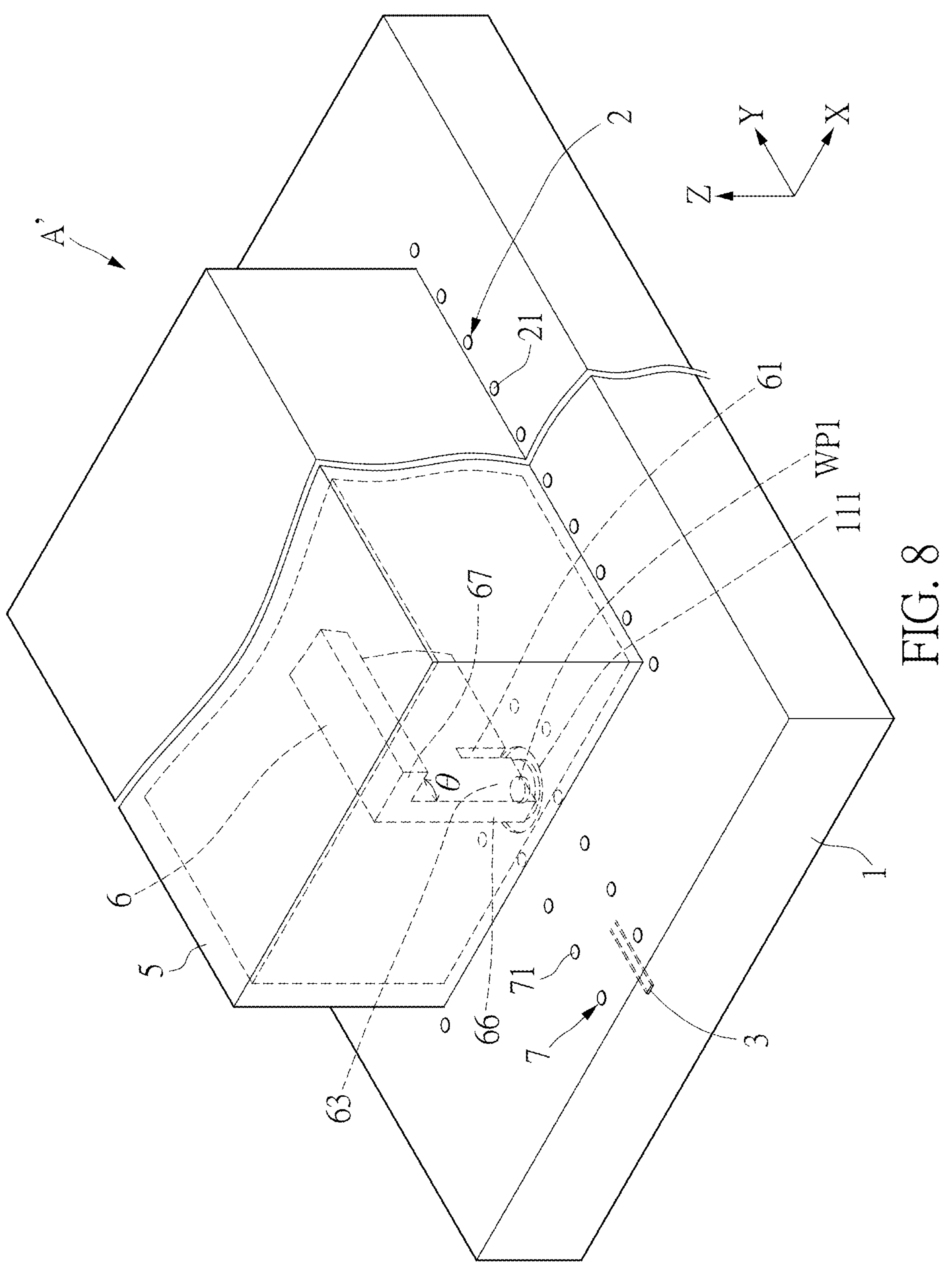
FIG. 8 is a schematic perspective view of a millimeter wave circuit structure according to a second embodiment of the present disclosure.

FIG. 8 is a schematic perspective view of a millimeter wave circuit structure A' according to a second embodiment of the present disclosure. Comparing the millimeter wave circuit structure A' of FIG. 8 with the millimeter wave circuit structure A of FIG. 1, differences between the millimeter wave circuit structure A' and the millimeter wave circuit structure A are described as follows. The metal sheet 6 of the millimeter wave circuit structure A' further includes a first plate 66 and a second plate 67. One side of the first plate 66 is provided with the first notch 61 and the second notch 62 (FIG. 3) and connected to the first welding pad WP1 and the second welding pad WP2 (FIG. 3). The second plate 67 is connected to the other side of the first plate 66 and is bent at a bending angle θ relative to the first plate 66. The bending angle θ can be an acute angle, a right angle or an obtuse angle.

Figures 9, 10:
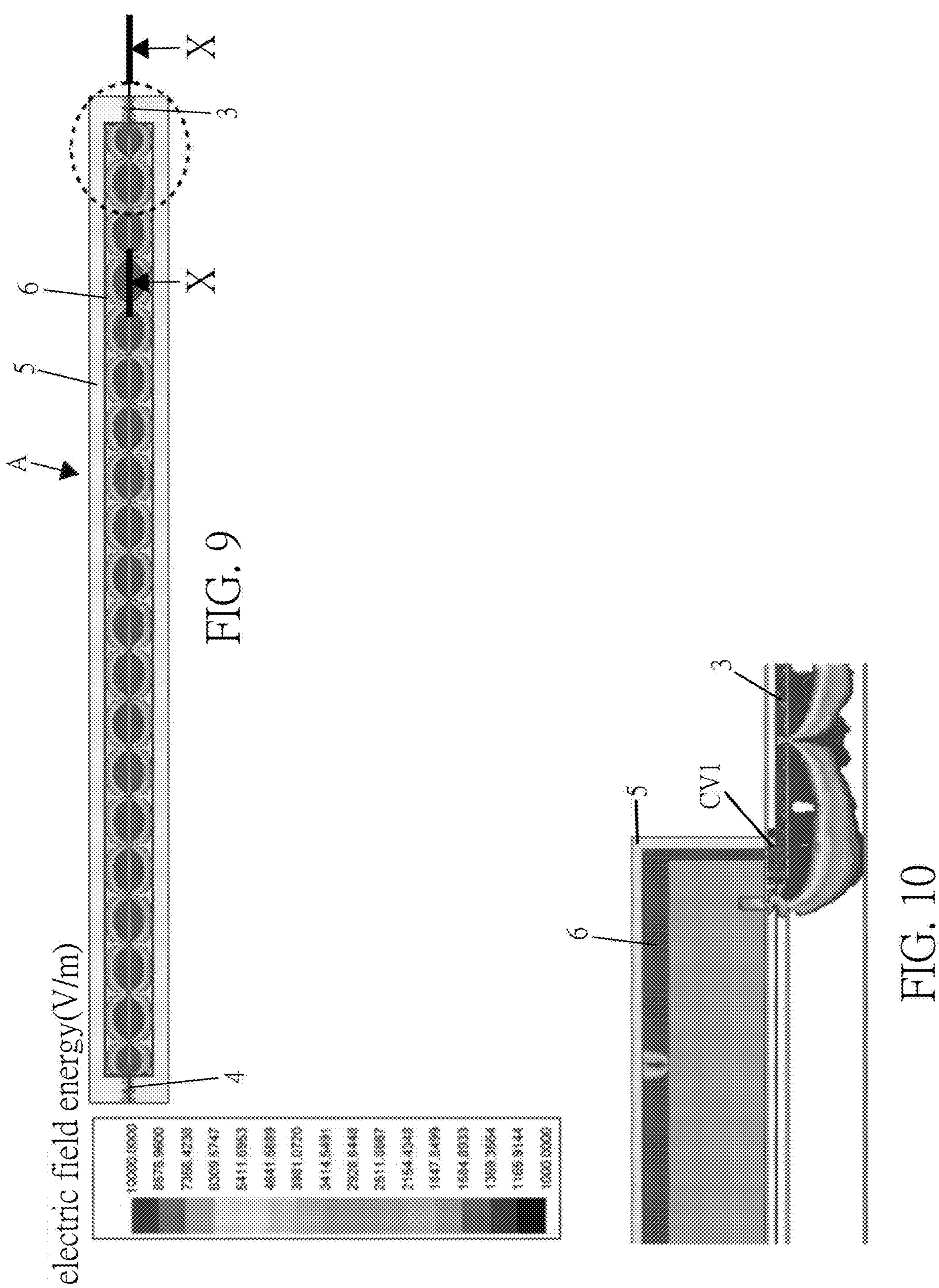
FIG. 9 is a partial schematic top view of electric field energy distribution of the millimeter wave circuit structure of FIG. 1.
FIG. 10 is a schematic cross-sectional view taken along line X-X of FIG. 9.

FIG. 9 is a partial schematic top view of electric field energy distribution (V/m, the values in the legend box) of the millimeter wave circuit structure A of FIG. 1, and FIG. 10 is a schematic cross-sectional view taken along line X-X of FIG. 9. After an electromagnetic wave signal feeds the signal feed-in structure 3, the electromagnetic wave signal is transmitted to the signal feed-out structure 4 (FIG. 9) via the first conductive through-hole CV1, the air between the metal shielding cover 5 and the metal sheet 6 as shown in FIG. 10, and the second conductive through-hole CV2 (FIG. 3). The metal sheet 6 is covered by the metal shielding cover 5. In addition, the metal shielding cover 5 has a certain thickness to prevent the electromagnetic wave signal from being interfered by external noise.

Figure 11:
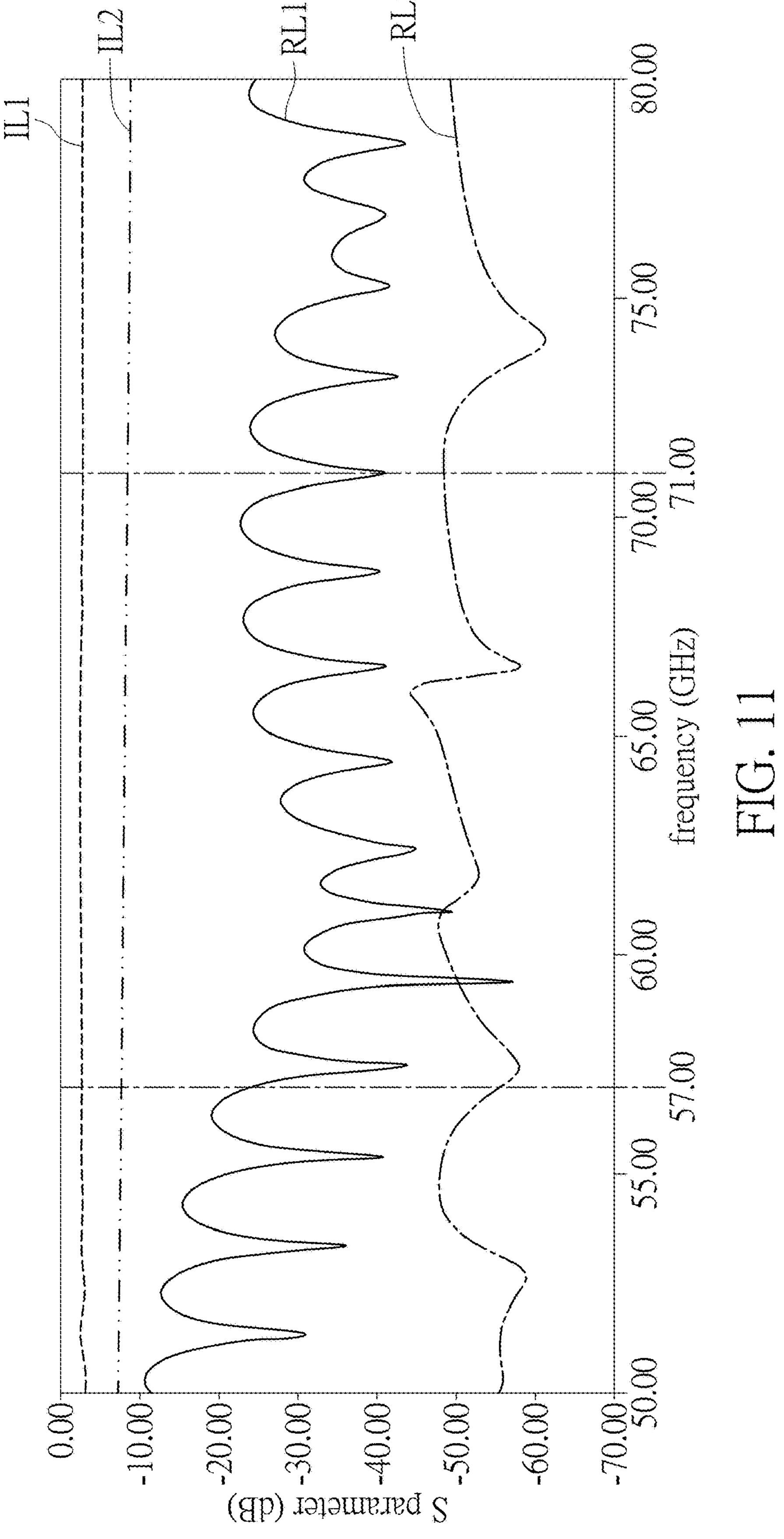
FIG. 11 is a comparison schematic view of insertion loss and reflection loss between the millimeter wave circuit structure of FIG. 1 and a conventional millimeter wave circuit structure.

FIG. 11 {frequency (GHz), S parameters (dB)} is a comparison schematic view of S parameters in dB, such as insertion loss and reflection loss between the millimeter wave circuit structure A of FIG. 1 and a conventional millimeter wave circuit structure. For example, the substrate 1 (FIG. 1) has a length about 60 mm. In the frequency band (57~71 GHz) of the Frequency Range 2 (FR2), a first insertion loss IL1 of the millimeter wave circuit structure A is approximately between −1.08 dB and −1.16 dB. A second insertion loss IL2 of a stripline structure with a length of 60 mm is approximately between −6.20 dB and −7.03 dB. Therefore, the first insertion loss IL1 is less than the second insertion loss IL2 and a difference between the first insertion loss IL1 and the second insertion loss IL2 is approximately between 5.1 dB and 5.8 dB. A first reflection loss RL1 of the millimeter wave circuit structure A of the present disclosure is approximately between −23.09 dB and −40.39 dB, and the second reflection loss RL2 of the stripline structure with a length of 60 mm is approximately between −47.90 dB and −55.25 dB. The reflection loss of the millimeter wave circuit structure A of the present disclosure is below −15 dB or even below −20 dB, so that the millimeter wave circuit structure A complies with the 5G standard and is suitable for 5G millimeter wave applications.

With respect to a conventional testing of a millimeter wave module, a radio frequency signal of the millimeter wave module is transmitted by a stripline of a printed circuit board. However, as shown in FIG. 11, when a transmission distance is 60 mm, a difference between the energy loss of the millimeter wave circuit structure A of the present disclosure and the energy loss of the stripline is approximately greater than or equal to 5 dB. Therefore, the energy loss difference is about 9 dB per 10 cm. The length and width of the test carrier board of the millimeter wave module measurement device are approximately 40 cm. The wiring of the test carrier board must be longer for transmitting the electromagnetic wave signal, so that the energy loss is greater when the electromagnetic wave signal is transmitted in the medium of the test carrier board.

Therefore, the millimeter wave circuit structure of the present disclosure can also be applied to a millimeter wave module measurement device to improve the quality of signal transmission.

Figure 12:
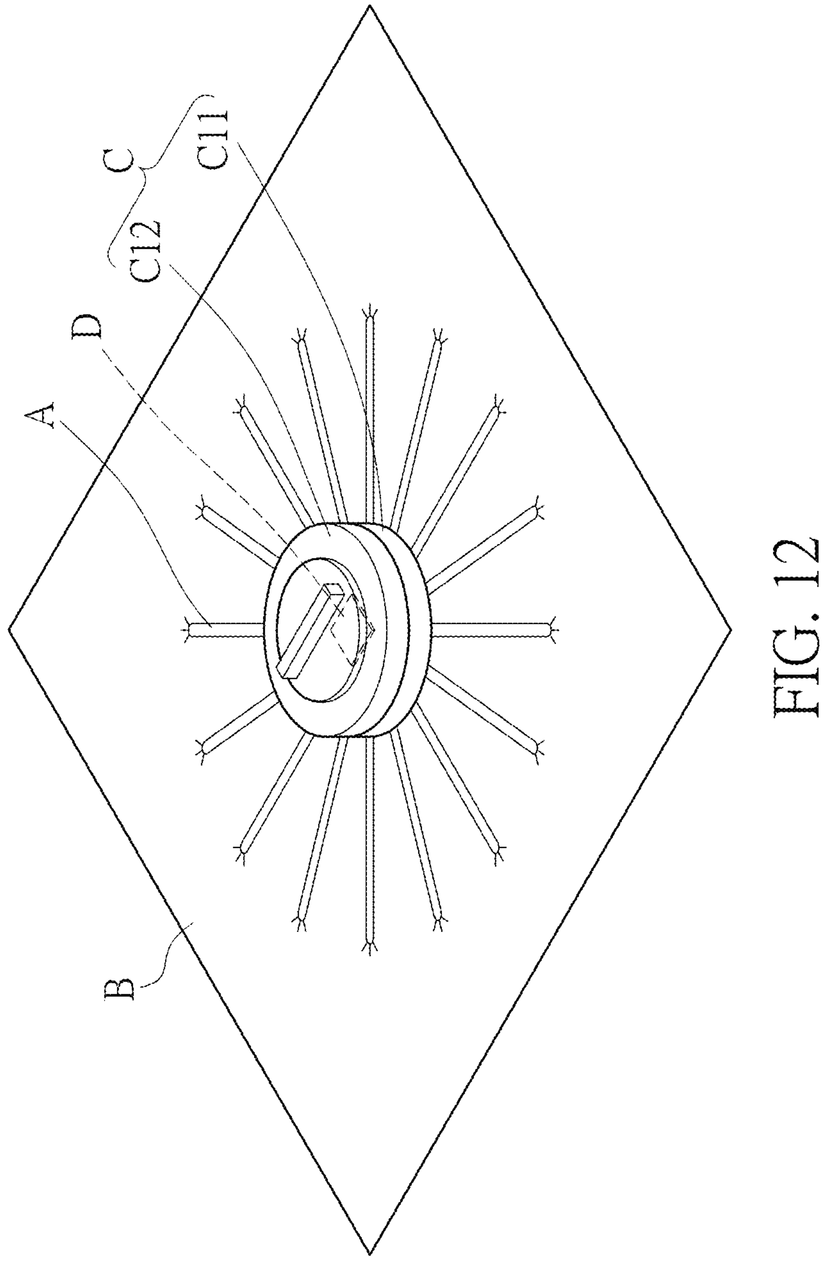
FIG. 12 is a schematic perspective view of a millimeter wave module measurement device according to one embodiment of the present disclosure.

FIG. 12 is a schematic perspective view of a millimeter wave module measurement device according to one embodiment of the present disclosure. Referring to FIG. 12, the millimeter wave module measurement device includes a measurement carrier board B, a jig C and a plurality of millimeter wave circuit structures A of FIG. 1. The jig C includes a jig bracket C11 and a jig cover C12. The jig bracket C11 is assembled to the measurement carrier board B and used to carry a millimeter wave module D. The jig cover C12 is assembled to the jig bracket C and shields the millimeter wave module D. The plurality of millimeter wave circuit structures A are connected to the measurement carrier board B.

Figure 13:
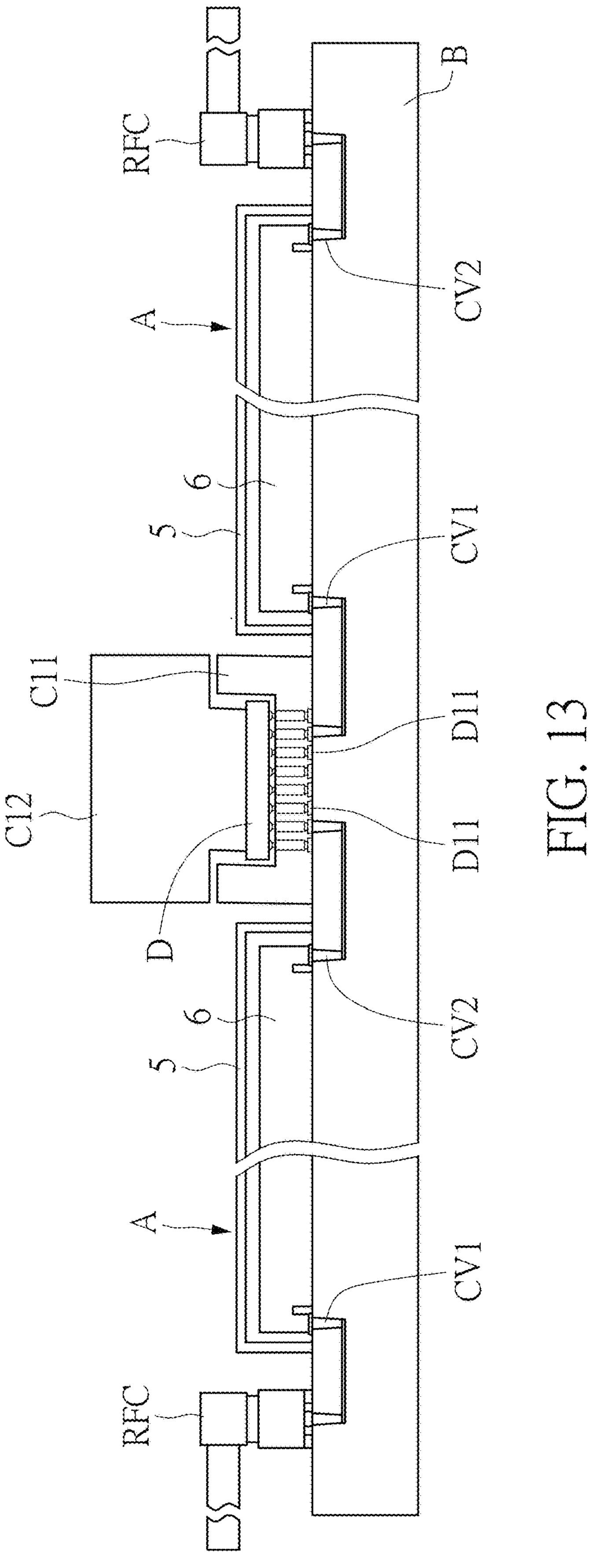
FIG. 13 is a schematic view showing the millimeter wave circuit structure of FIG. 12 being connected to the millimeter wave module.

FIG. 13 is a schematic view showing the millimeter wave circuit structure of FIG. 12 being connected to the millimeter wave module. The millimeter wave module D includes a plurality of signal pins D11, and the plurality of signal feed-in structures 3 (FIG. 2) of the plurality of millimeter wave circuit structures A are electrically connected to the plurality of signal pins D11 of the millimeter wave module D through radio frequency traces. In addition, the signal feed-out structure 4 (FIG. 2) of the millimeter wave circuit structure A can be connected with a radio frequency connector RFC or a GSG pad so that a measuring instrument can measure the plurality of signal pins D11 of the millimeter wave module D.

Beneficial Effects of the Embodiment

In conclusion, in the millimeter wave circuit structure and the millimeter wave module measurement device provided by the present disclosure, after an electromagnetic wave signal feeds the signal feed-in structure, the air between the metal shielding cover and the metal sheet acts as a medium for transmitting the electromagnetic wave signal to the signal feed-out structure. Since the air acts as the medium for transmitting the electromagnetic wave signal, the energy loss of the electromagnetic wave signal is reduced. Moreover, the metal shielding cover also prevents the electromagnetic wave signal from being interfered by external noise, so that the insertion loss of the electromagnetic wave signal and the reflection loss of the electromagnetic wave signal may meet the requirement for the millimeter wave frequency band.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A millimeter wave circuit structure, comprising:

a substrate provided with a first conductive through hole, a second conductive through hole, a first welding pad, and a second welding pad;

wherein the first conductive through hole and the second conductive through hole are connected to the first welding pad and the second welding pad, respectively;

two metal through hole groups penetrating the substrate;

a signal feed-in structure provided inside the substrate and connected to the first conductive through hole;

a signal feed-out structure provided inside the substrate and connected to the second conductive through hole;

a metal shielding cover connected to a top of the substrate and located between the two metal through hole groups; and a metal sheet;

wherein a first side of the metal sheet is connected to the first welding pad and the second welding pad, the metal sheet is located inside the metal shielding cover and the first side of the metal sheet is provided with a first notch and a second notch, and the metal sheet is electrically connected to the signal feed-in structure and the signal feed-out structure by the first conductive through hole and the second conductive through hole, respectively.

2. The millimeter wave circuit structure according to claim 1, wherein a ratio of a width of the first notch to a height of the first notch is greater than two and less than or equal to twenty, and a ratio of a width of the second notch to a height of the second notch is greater than two and less than or equal to twenty.

3. The millimeter wave circuit structure according to claim 1, wherein the first side of the metal sheet is provided with a first leg portion, a second leg portion and a third leg portion, the first notch is located between the first leg portion and the third leg portion and is connected to the first welding pad; wherein the second notch is located between the third leg portion and the second leg portion and is connected to the second welding pad.

4. The millimeter wave circuit structure according to claim 1, wherein the first notch has a third width, a second distance is defined between the metal sheet and the metal shielding cover along a second direction, and a ratio of the second distance to the third width is equal to one.

5. The millimeter wave circuit structure according to claim 3, wherein the metal sheet includes a first plate and a second plate, the first plate is connected to the first welding pad and the second welding pad, the first plate is provided with the first notch and the second notch, the second plate is connected to the first plate, and the second plate is bent at a bending angle relative to the first plate.

6. A millimeter wave module measure equipment, comprising:

a measurement carrier board;

a jig assembled to the measurement carrier board and being configured to carry a millimeter wave module, wherein the millimeter wave module includes a plurality of signal pins; and a plurality of millimeter wave circuit structures assembled on the measurement carrier board and electrically connected to the plurality of the signal pins, respectively;

wherein each of the millimeter wave circuit structures includes:

a substrate provided with a first conductive through hole, a second conductive through hole, a first welding pad and a second welding pad, wherein the first conductive through hole and the second conductive through hole are connected to the first welding pad and the second welding pad, respectively;

two metal through hole groups, each of the metal through hole groups penetrating the substrate;

a signal feed-in structure provided inside the substrate and connected to the first conductive through hole and one of the signal pins, correspondingly;

a signal feed-out structure provided inside the substrate and connected to the second conductive through hole;

a metal shielding cover connected to a top of the substrate and located between the two metal through hole groups;

a metal sheet, wherein a first side of the metal sheet is connected to the first welding pad and the second welding pad, the metal sheet is located inside the metal shielding cover and the first side of the metal sheet is provided with a first notch and a second notch, and the metal sheet is electrically connected to the signal feed-in structure and the signal feed-out structure by the first conductive through hole and the second conductive through hole, respectively.

7. The millimeter wave module measure equipment according to claim 6, wherein a ratio of a width of the first notch to a height of the first notch is greater than two and less than or equal to twenty, and a ratio of a width of the second notch to a height of the second notch is greater than two and less than or equal to twenty.

8. The millimeter wave module measure equipment according to claim 6, wherein the first side of the metal sheet is provided with a first leg portion, a second leg portion and a third leg portion, the first notch is located between the first leg portion and the third leg portion, the first leg portion is connected to the first welding pad, the second notch is located between the third leg portion and the second leg portion, and the second leg portion is connected to the second welding pad.

9. The millimeter wave module measure equipment according to claim 6, wherein the first notch has a third width, a second distance is defined between the metal sheet and the metal shielding cover along a second direction, and a ratio of the second distance to the third width equal to one.

10. The millimeter wave module measure equipment according to claim 6, wherein the metal sheet includes a first plate and a second plate, the first plate is connected to the first welding pad and the second welding pad, the first plate is provided with the first notch and the second notch, the second plate is connected to the first plate, and the second plate is bent at a bending angle relative to the first plate.

* * * * *